United States Patent [19]
Kim et al.

[11] Patent Number: 5,991,347
[45] Date of Patent: Nov. 23, 1999

[54] SYMBOL TIMING RECOVERY CIRCUIT FOR A BASE BAND COMMUNICATION SYSTEM USING A PLURALITY OF CHANNELS

[75] Inventors: Beom Sup Kim; Byung Jin Chun, both of Daejeon, Rep. of Korea

[73] Assignee: LG Semicon Co., Ltd., Cheongju, Rep. of Korea

[21] Appl. No.: 08/907,646

[22] Filed: Aug. 11, 1997

[51] Int. Cl.$^6$ ........................................... H04L 7/00
[52] U.S. Cl. .................. 375/355; 713/400; 713/401; 713/503
[58] Field of Search ..................... 375/355, 359, 375/326, 327; 714/700; 713/400, 401, 503

[56] References Cited

U.S. PATENT DOCUMENTS

| | | | |
|---|---|---|---|
| 5,724,397 | 3/1998 | Torsti | 375/355 |
| 5,859,671 | 1/1999 | Kim | 348/537 |
| 5,914,986 | 6/1999 | Ohta et al. | 375/328 |

Primary Examiner—Stephen Chin
Assistant Examiner—Mohammad Ghayour
Attorney, Agent, or Firm—Fleshner & Kim

[57] ABSTRACT

A symbol timing recovery circuit for a base band communication system having a plurality of channels includes a main ADC-STR (analog to digital converter - symbol timing recovery) unit and a plurality of sub ADC-STR units. The main ADC-STR detects a timing error of a first received signal and uses the detected value as a sampling signal of the first received signal. The plurality of sub- ADC-STR units compares the sampling signal generated from the main ADC-STR unit and a symbol timing signal following the first receive signal. Each of the sub ADC-STR units delays the sampling signal in accordance with the compared value for a predetermined time. The delayed signal is used as a sampling signal. The circuit employs a voltage-controlled oscillator VCO in a main ADC-STR circuit, but a VCO is not used in the sub- ADC-STR circuits, so as to delay an output signal of the main ADC-STR circuit and achieve a phase locked loop. Hence, mutual interference between the voltage-controlled oscillators is avoided.

11 Claims, 4 Drawing Sheets

SYMBOL TIMING RECOVERY CIRCUIT FOR A BASE BAND COMMUNICATION SYSTEM USING A PLURALITY OF CHANNELS

BACKGROUND OF THE INVENTION

1. Field of the Invention

The present invention relates to a pulse amplitude modulation (hereinafter, "PAM") communication system, and more particularly, to an improved symbol timing recovery circuit for a PAM communication system.

2. Background of the Related Art

FIG. 1 illustrates a basic base band PAM communication system. The system includes a PAM unit 10 in a transmit terminal for modulating the pulse width of a binary data signal ak and outputting an analog signal s(t), an analog/digital converter (hereinafter, "ADC") 20 for converting an analog signal r(t) received from a channel CH into a digital signal rk and a symbol timing recovery (hereinafter, "STR") circuit 30 for receiving output signal rk of the ADC 20, and carrying out a timing error detection and correction and feeding back the corrected signal to the ADC 20. An equalizer 40 removes the noise components from output signal rk of the ADC 20 and a slicer 50 converts an output signal of equalizer 40 to a binary data signal ^ak.

At this time, the STR circuit 30 outputs a sampling signal either in accordance with signal r(t) applied to ADC 20 (feed forward method, as shown in dotted line) or in accordance with signal rk outputted from ADC 20 (feed back method). Here, the feed back method is employed to take advantage of digital signal processing capability.

FIG. 2 depicts a block diagram of a PAM communication system including a plurality of channels, each of the channels CH1, . . . , CHn basically includes a base band PAM communication system. A serial-to-parallel converter (hereinafter, "SPC") 60 and a parallel-to-serial converter (hereinafter, "PSC") 70 serve to integrate the respective channels CH1, . . . , CHn.

FIG. 3 shows a plurality of ADC-STR circuits in the system of FIG. 2. The ADC-STR circuits are identical to each other in structure and can be respectively broadly regarded as a phase locked loop (hereinafter, "PLL"). Here, the PLL operation principle is based on an algorithm of "Symbol Timing Recovery" disclosed in the article entitled "Timing Recovery in Digital Synchronous Data Receiver" by K. Mueller and M. Muller, IEEE. T_COM, May 1996. The plurality of STRs 30-1, . . . , 30-n each respectively include a timing error detector (hereinafter, "TED") 11 for receiving a corresponding one of digital signals $r^1k, \ldots r^n k$ outputted from ADCs 20-1, . . . , 20-n, and a voltage controlled oscillator (hereinafter, "VCO") 12 for being oscillated in accordance with a timing error signal outputted from TED 11 and outputting a sampling signal to a corresponding one of ADCs 20-1, . . . , 20-n.

The operation of the thusly constituted base band PAM communication system will now be described with reference to FIGS. 2 and 3. First, a transmit terminal Tx distributes binary data ak (k=0, 1, 2 . . . ) to the plurality of channels CH1, . . . , CHn through the SPC 60. The distributed binary data $b^1k, \ldots b^n k$ are converted to analog signals $s^1(t), \ldots, s^n(t)$ in PAM units 10-1, . . . , 10-n.

In a receive terminal Rx, the received signals $r^1(t), \ldots r^n(t)$ are formed into digital signals $r^1k, \ldots r^n k$ through the ADCs 20-1, . . . , 20-n. At this time, a sampling signal according to an exact timing is required in ADCs 20-1, . . . , 20-n. That is, as shown in FIG. 3, TEDs 11 respectively detect timing error signals from digital signals $r^1k, \ldots r^n k$ outputted from ADCs 20-1, . . . , 20-n, and respectively drive the VCOs 12 with voltages proportional to the detected timing error signal, whereby sampling signals respectively outputted from the VCOs 12 are respectively applied to ADCs 20-1, . . . , 20-n.

Each of the ADCs 20-1, . . . , 20-n carries out a sampling operation with regard to respective received digital signals $r^1(k), \ldots r^n(k)$ and output respective digital signals $r^1k, \ldots r^n k$ from which timing errors are removed. The equalizers 40-1, . . . , 40-n serve to restrain distortion or noise which has occurred in the channels. Binary digits $^b^1k, \ldots ^b^n k$ are respectively restored through the slicers 50-1, . . . , 50-n. Therefore, the binary digits $^b^1k, \ldots ^b^n k$, which are processed independently at each channel and in parallel, are integrated in the PSC 70 and restored into a series of serial data ^ak which are finally outputted.

As described above, in the PAM communication system including a plurality of channels, an N plurality of VCOs 12 is required because the ADC-STR circuits are independently operated. Here, the N plurality of VCOs 12 is operated under an identical frequency so that it is impossible to avoid mutual interference, resulting in disabling a normal PLL operation. In addition, when an N plurality of receivers corresponding to an N plurality of channels is integrated in a single chip, the interference between the VCOs is further increased, thereby failing a normal timing recovery.

The above references are incorporated by reference herein where appropriate for appropriate teachings of additional or alternative details, features and/or technical background.

SUMMARY OF THE INVENTION

An object of the present invention is to solve the problems of the related art.

Another object of the present invention is to avoid mutual interferences.

A further object of the present invention is to eliminate interferences.

Accordingly, it is an object of the present invention to provide a symbol timing recovery circuit for a PAM communication system using a plurality of channels which allows employment of a voltage-controlled oscillator in a main ADCSTR circuit without the voltage-controlled oscillator in sub- ADC-STR circuits, so as to delay an output signal of the main ADC-STR circuit and achieve a phase locked loop thereof, thereby avoiding interferences between voltage-controlled oscillators.

To achieve the above-described object, there is provided a symbol timing recovery circuit for a base band communication system having a plurality of channels that includes a main analog to digital converter - symbol timing recovery (ADC-STR) unit that detects a timing error of a first received signal and that uses the detected timing error as a sampling signal of the first received signal and at least one sub-ADC-STR unit that compares the sampling signal generated from the main ADC-STR unit and a symbol timing signal following the first received signal, and that delays the sampling signal in accordance with a compared value for a predetermined time, for use as its sampling signal.

The present invention may be achieved in whole or in part by a symbol timing recovery circuit for a base band communication system having a plurality of channels that includes a main analog to digital converter-symbol timing recovery unit that detects a timing error a first signal, which is used as a sampling signal of the first signal; a plurality of sub analog to digital converter-symbol timing recovery units, each having a first analog-to-digital converter, a first timing error detector coupled to the first analog-to-digital converter to detect a first timing error; an accumulator for accumulating the first timing error from the first timing error detector; and a voltage controlled delay unit, coupled to receive the sampling signal from the main analog to digital converter-symbol timing recovery unit, the voltage controlled delay unit delays the sampling signal in accordance with an output signal of the accumulator and outputs the delayed sampling signal to the first analog-to-digital converter.

The present invention may be also achieved in part or in whole by a base band communication system, including a serial-to-parallel converter; a parallel-to-serial converter; and a plurality of channels coupled between the serial-to-parallel converter and the parallel-to-serial converter, wherein the plurality of channels includes a main channel having a main transmit terminal and a main receive terminal, the main receive terminal having a main analog to digital converter -symbol recovery unit (ADC-STR) unit that detects a timing error of a first received signal and that uses the detected error as a sampling signal of the first received signal, and at least one sub ADC-STR unit that compares the sampling signal generated from the main ADC-STR unit and a symbol timing signal following the first received signal, and that delays the sampling signal in accordance with a compared value for a predetermined time for use as its sampling signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
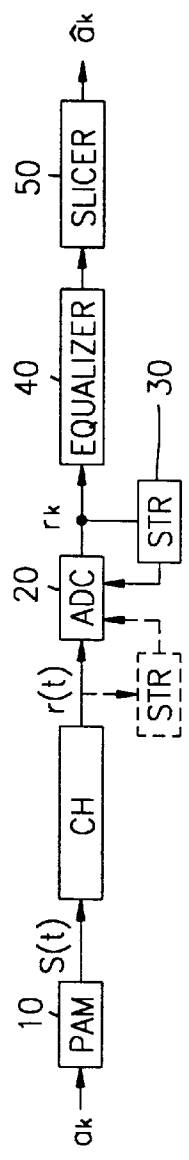
FIG. 1 is a schematic block diagram showing the basic structure of a base band PAM communication system.
Figure 2:
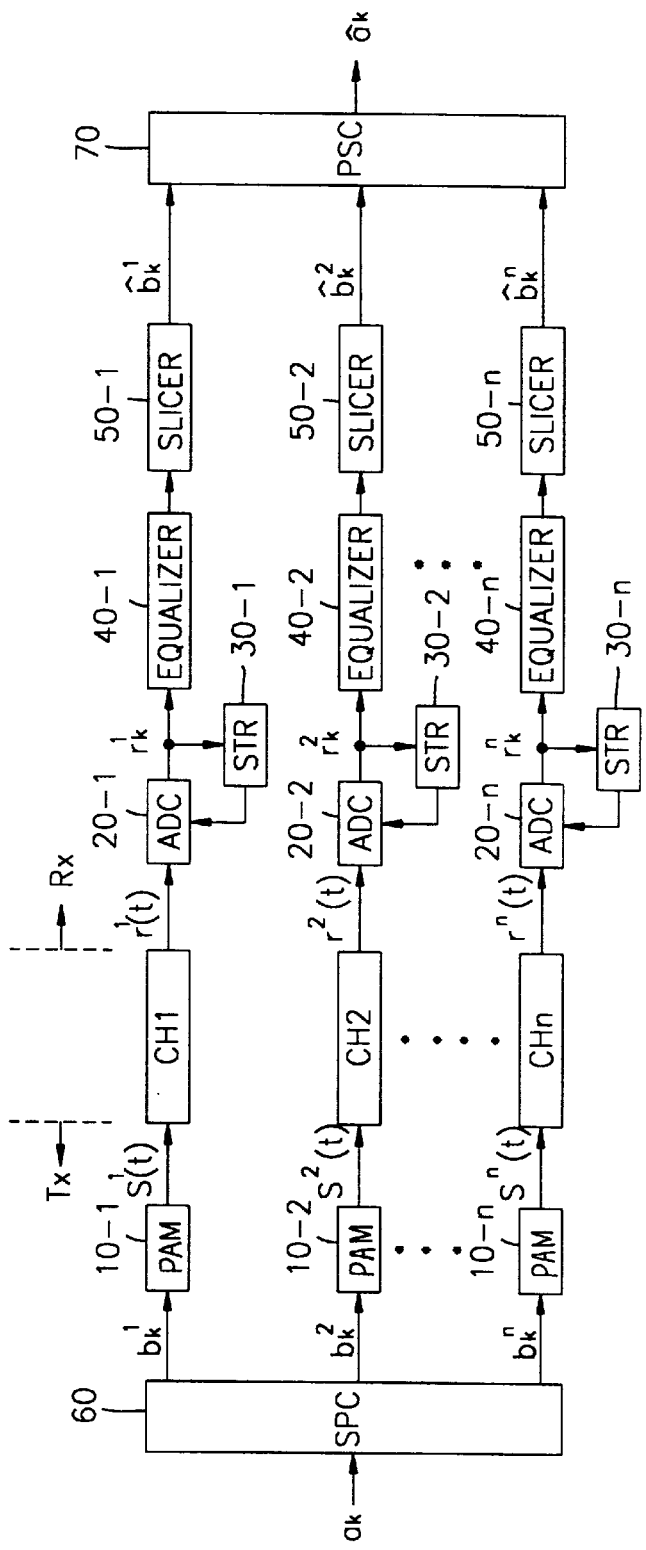
FIG. 2 is a schematic block diagram of a PAM communication system including a plurality of channels.
Figure 3:
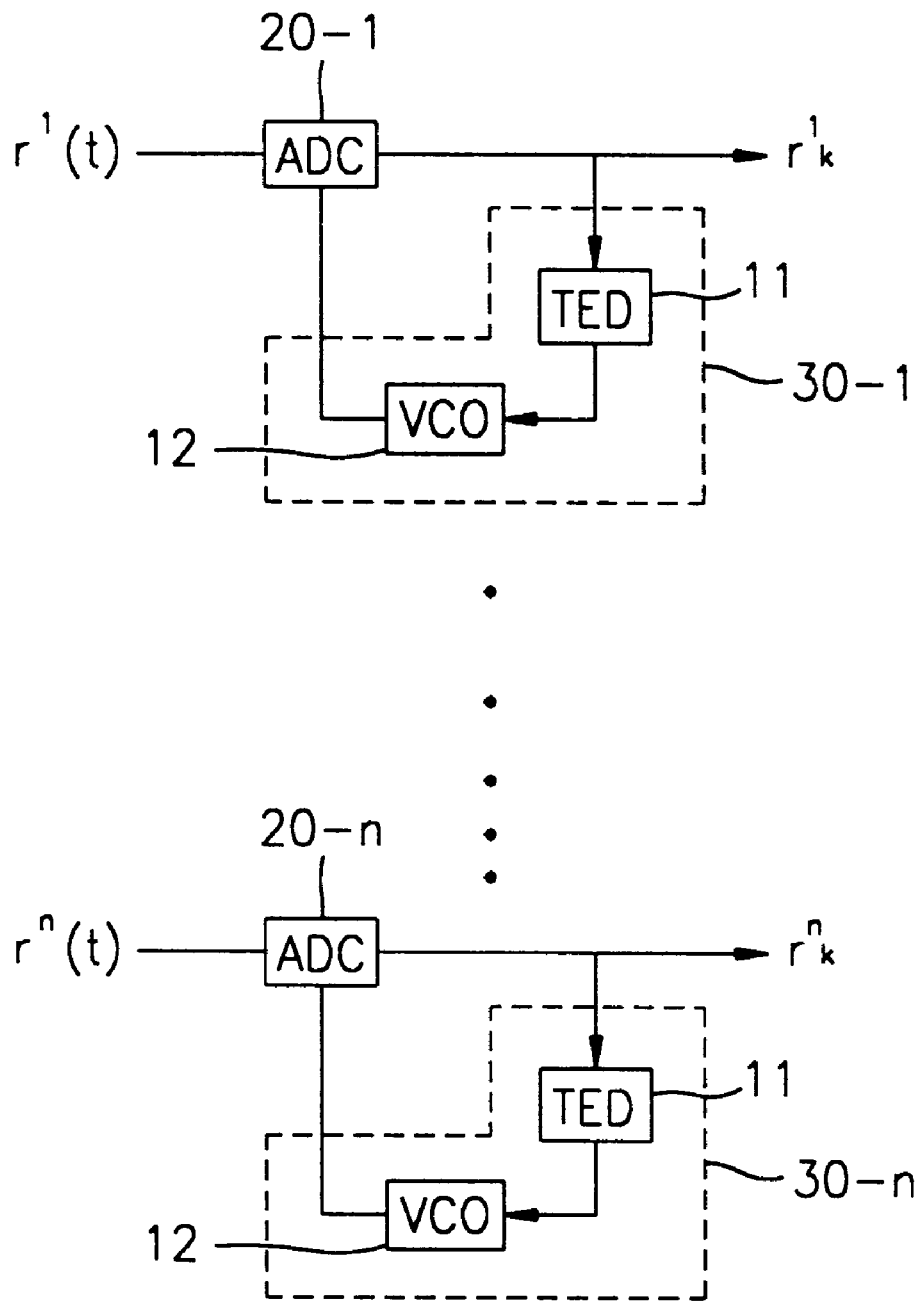
FIG. 3 is a detailed block diagram of an ADC-STR circuit in the system of FIG. 2.
Figure 4:
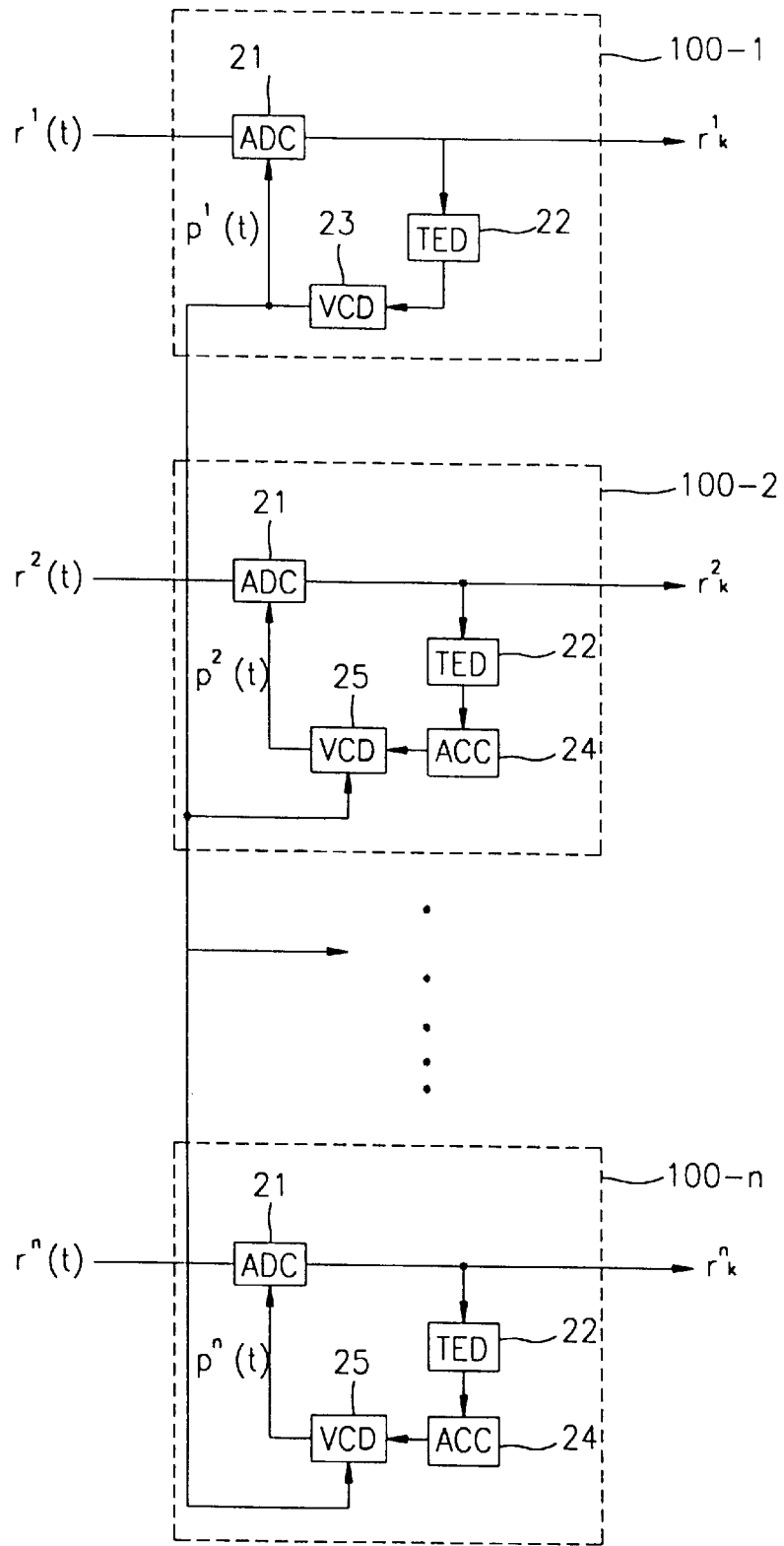
FIG. 4 is a block diagram of an ADC-STR circuit in accordance with the present invention.

As shown in FIG. 4, the ADC-STR circuit according to the present invention comprises of a main ADC-STR circuit 100-1 and an (N-1) plurality of sub- ADC-STR circuits 100-2, . . . , 100-n. The main ADC-STR circuit 100-1 includes a TED 22 for receiving an output value of ADC 21 and detecting a timing error occurring between a transmit terminal and a receive terminal, and a VCO 23, which oscillates in accordance with a timing error signal of the TED 22 and outputs a sampling signal $p^1(t)$ to the ADC 21.

Each of the sub- ADC-STR circuits 100-2, . . . , 100-n includes an ADC 21, a TED 22, an accumulator (hereinafter, "ACC") 24 for accumulating therein a timing error signal outputted from the TED 22, and a voltage controlled delay (hereinafter, "VCD") unit 25. The VCD 25 unit receives a sampling signal $p^2(t)$ outputted from the VCO 23 in the main ADC-STR circuit 100-1, controls a delay time of the sampling signal $p^1(t)$ in accordance with an output value of the ACC 24 and then outputs the controlled value $p^2(t)$-$p^n(t)$ to the ADC 21.

Figure 5:
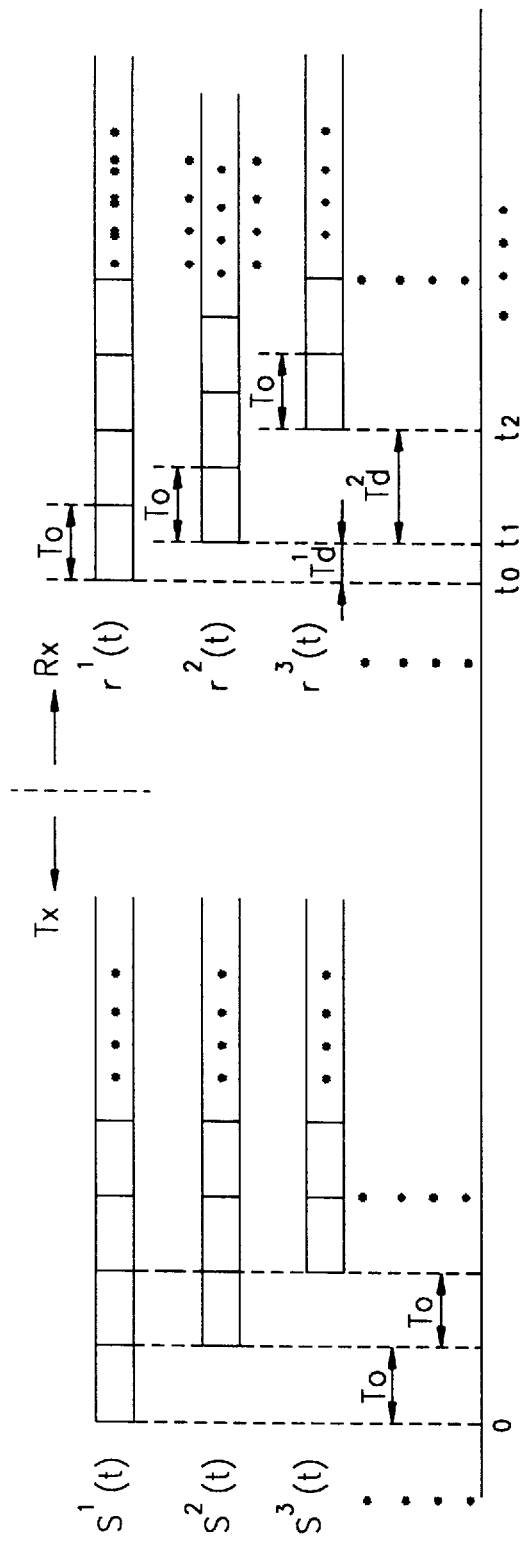
FIG. 5 is a graph showing a transmitting/receiving signal timing in accordance with the present invention.

As shown in FIG. 5, a transmit terminal Tx1 initially transmits an analog signal $s^1(t)$, and the transmit terminals Tx2, . . . , Txn sequentially transmit analog signals $s^2(t)$, . . . , $s^n(t)$. Because a time difference between receiving signals $r^1(t)$, . . . $r^n(t)$ does not exactly reach up to a symbol cycle T0, which results in a difference in a transmitting characteristic of the transmitting channels CH1, . . . , CHn, there occur minor $Td^1$, . . . , $Td^n$, which do not exceed the symbol cycle ±T0. An input signal $r^1(t)$ of the receiving terminal Rx1 is first received and accompanied by the input signals $r^2(t)$, . . . $r^n(t)$ of the receiving terminals Rx2, . . . , Rxn.

Figure 6:
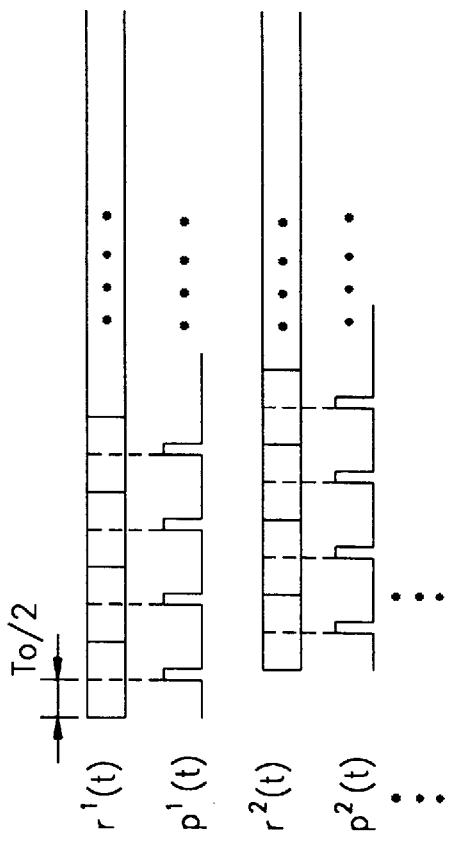
FIG. 6 is a timing view of respective sampling signals with regard to receiving signals in accordance with the present invention.

As shown in FIG. 6, the main ADC-STR circuit of 100-1 of the receiving terminal Rx1 generates a sampling pulse signal $p^1(t)$ from a receiving signal $r^1(t)$ so as to meet a symbol timing in accordance with an independent PLL operation principle. At this time, an initial phase of the VCO 23 fits a zero crossing point of the receiving signal $r^1(t)$, thereby obtaining a zero phase start.

The sub- ADC-STR circuits 100-2, . . . , 100-n of the receiving terminals Rx2, . . . , Rxn commonly receive the sampling pulse signal $p^1(t)$ from the main ADC-STR 100-1. The sub ADC-STR circuits 100-2, . . . , 100-n delay for a predetermined time the sampling pulse signal $p^1(t)$ in accordance with an output value of their corresponding TED 22. As shown in FIG. 6, the delayed pulse signals are employed as sampling pulse signals $p^2(t)$, . . . $p^n(t)$ in relation with the respective input signals $r^2(t)$, . . . $r^n(t)$.

For example, if the present timing error values detected initially in the respective TEDs 22 are positive, that is to say, if the timing of the sampling pulse signals $p^2(t)$, . . . $p^n()$ denoting output values of the VCDs 25 are faster than the symbol timing of the respectively corresponding receiving signals $r^2(t)$, . . . $r^n(t)$, the delay time is increased. If the present timing error detected in the TEDs 22 is negative, that is, if the timing of sampling pulse signals $p^2(t)$, . . . $p^n(t)$ denoting respective output values of the VCDs 25 is slower than the symbol timing of the respective corresponding receiving signals $r^2(t)$, . . . $r^n(t)$, the delay time is decreased. In both cases, the timing error is eliminated.

As a result, each VCD 25 in the sub- ADC-STR circuits 100-2, . . . , 100-n serves as a time delay device for controlling a delay time amount in accordance with the time delay control voltage in accordance with the accumulated time error values of the ACCs 24.

Also, a time interval between a zero crossing point of receiving signal $r^1(t)$ in the main ADC-STR circuit 100-1 and the zero crossing points of respective receiving signals $r^2(t)$, . . . $r^n(t)$ in the sub- ADC-STR circuits 100-2, . . . , 100-n are applied to the corresponding VCDs 25 as a initial delay amount, thereby realizing a zero phase start.

The VCD 25 does not have an error accumulating function, unlike the VCO 23. Accordingly, the VCD 25 is not able to chase the timing of the receiving signals $r^2(t)$, . . . $r^n(t)$, so that the ACCs 24 are placed between TEDs 22 and VCDs 25 to chase the timing of the receiving signals $r^2(t)$, ... $r^n(t)$. For convenience, a loop filter can be inserted between the TED 22 and the VCD 25 in the main ADC-STR circuit 100-1 or between the TEDs 22 and the VCDs 25 in the sub- ADC-STR circuits 100-2, ... , 100-n so as to stabilize the circuit operation.

As described above, according to the present invention, when a plurality of ADC-STR circuits are applied to a base band communication system using a plurality of channels, a single main ADC-STR circuit adopts a VCO, whereas in the remaining sub-ADC-STR circuits, the sampling signal outputted from the main ADC-STR circuit is delayed in respective VCDs for thereby obtaining a PLL locking and fundamentally excluding an inter-VCO interference. Further, when the present invention is applied to a large scale integrated circuit, a more exact symbol timing recovery can be obtained.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A symbol timing recovery circuit for a base band communication system having a plurality of channels, comprises:
    a main analog to digital converter-symbol timing recovery (ADC-STR) unit that detects a timing error of a first received signal and that uses the detected timing error as a sampling signal of the first received signal; and
    at least one sub- ADC-STR unit that compares the sampling signal generated from the main ADC-STR unit and a symbol timing signal following the first received signal, and that delays the sampling signal in accordance with a compared value for a predetermined time, for use as the sampling signal of said sub ADC-STR unit.

2. The circuit of claim 1, wherein the main ADC-STR unit comprises:
    an analog-to-digital converter (ADC) that converts the receive signal into a digital signal in accordance with the sampling signal;
    a time error detector (TED) that receives an output value of said ADC and detects a timing error occurring between a transmit terminal and a receive terminal; and
    a voltage controlled oscillator (VCO) that oscillates in accordance with a timing error signal outputted from the TED and outputs a sampling signal to said ADC.

3. The circuit of claim 1, wherein the at least one sub-ADC-STR unit includes an analog-to-digital converter (ADC), a timing error detector (TED), an accumulator for accumulating therein a timing error signal outputted from the TED, and a voltage-controlled delay unit (VCD) for receiving the sampling signal outputted from said main ADC-STR unit, controlling a delay time of the sampling signal in accordance with an output value of the accumulator, and outputting the delayed signal to the ADC.

4. The circuit of claim 3, wherein when a timing error value detected from said TED remains positive, said VCD increases a delay time of the sampling signal applied thereto from the main ADC-STR unit, and when the timing error value detected from the TED remains positive, the VCD decreases the delay time of a sampling signal applied thereto from the main ADC-STR unit.

5. A symbol timing recovery circuit for a base band communication system having a plurality of channels, comprising:
    a main analog to digital converter-symbol timing recovery unit that detects a timing error a first signal, which is used as a sampling signal of the first signal; and
    a plurality of sub analog to digital converter-symbol timing recovery units, each comprises,
        a first analog-to-digital converter,
        a first timing error detector coupled to said first analog-to-digital converter to detect a first timing error,
        an accumulator for accumulating the first timing error from said first timing error detector, and
        a voltage controlled delay unit, coupled to receive the sampling signal from said main analog to digital converter-symbol timing recovery unit, said voltage controlled delay unit delays the sampling signal in accordance with an output signal of said accumulator and outputs the delayed sampling signal to said first analog-to-digital converter.

6. The symbol timing recovery circuit of claim 5, wherein said main analog to digital converter-symbol timing recovery unit comprises:
    a second analog-to-digital converter that converts a received signal to a digital signal as the first signal;
    a second timing error detector coupled to said second analog-to-digital converter to detect a second timing error; and
    a voltage controlled oscillator that oscillates in accordance with the second timing error, and outputs the sampling signal.

7. The symbol timing recovery circuit of claim 5, wherein said first timing error detector is coupled to an output of said first analog-to-digital converter.

8. The symbol timing recovery circuit of claim 6, wherein said second timing error detector is coupled to an output of said second analog-to-digital converter.

9. A base band communication system, comprising:
    a serial-to-parallel converter;
    a parallel-to-serial converter; and
    a plurality of channels coupled between said serial-to-parallel converter and said parallel-to-serial converter, wherein said plurality of channels comprises,
        a main channel comprising a main transmit terminal and a main receive terminal, said main receive terminal having a main analog to digital converter-symbol recovery unit (ADC-STR) unit that detects a timing error of a first received signal and that uses the detected error as a sampling signal of the first received signal, and
        at least one sub ADC-STR unit that compares the sampling signal generated from the main ADC-STR unit and a symbol timing signal following the first received signal, and that delays the sampling signal in accordance with a compared value for a predetermined time for use as the sampling signal of said sub ADC-STR unit.

10. The circuit of claim 9, wherein the main ADC-STR unit comprises:
    an analog-to-digital converter (ADC) that converts the receive signal into a digital signal in accordance with the sampling signal;
    a time error detector (ED) that receives an output value of said ADC and detects a timing error occurring between a transmit terminal and a receive terminal; and a voltage controlled oscillator (VCO) that oscillates in accordance with a timing error signal outputted from the TED and outputs a sampling signal to said ADC.

11. The circuit of claim 9, wherein the at least one sub-ADC-STR unit includes an analog-to-digital converter (ADC), a timing error detector (TED), an accumulator for accumulating therein a timing error signal outputted from the TED, and a voltage-controlled delay unit VCD) for receiving the sampling signal outputted from said main ADC-STR unit, controlling a delay time of the sampling signal in accordance with an output value of the accumulator, and outputting the delayed signal to the ADC.

* * * * *

UNITED STATES PATENT AND TRADEMARK OFFICE
CERTIFICATE OF CORRECTION

PATENT NO.   : 5,991,347
DATED        : November 23, 1999
INVENTOR(S)  : Kim et al.

It is certified that error appears in the above-identified patent and that said Letters Patent is hereby corrected as shown below:

Title Page:
 [30]   Foreign Application Priority Data

Feb. 19, 1997   [KR]   Rep. of Korea ................ 4995/1997

Signed and Sealed this

Twenty-second Day of August, 2000

*Attest:*

Q. TODD DICKINSON

*Attesting Officer*    *Director of Patents and Trademarks*